(12) United States Patent
Cheng

(10) Patent No.: US 10,963,004 B2
(45) Date of Patent: *Mar. 30, 2021

(54) DISPLAY SCREEN, TERMINAL DISPLAY SCREEN ASSEMBLY, AND MOBILE TERMINAL

(71) Applicant: GUANGDONG OPPO MOBILE TELECOMMUNICATIONS CORP., LTD., Guangdong (CN)

(72) Inventor: Jiao Cheng, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/024,243

(22) Filed: Sep. 17, 2020

(65) Prior Publication Data

US 2021/0004047 A1    Jan. 7, 2021

Related U.S. Application Data

(63) Continuation of application No. 16/364,041, filed on Mar. 25, 2019, now Pat. No. 10,860,055.

(30) Foreign Application Priority Data

Mar. 30, 2018    (CN) .......................... 201810277792.5
Mar. 30, 2018    (CN) .......................... 201820450899.0

(51) Int. Cl.
*G06F 1/16*    (2006.01)
*H04M 1/02*    (2006.01)
*H05K 5/03*    (2006.01)

(52) U.S. Cl.
CPC .......... *G06F 1/1601* (2013.01); *G06F 1/1637* (2013.01); *G06F 1/1656* (2013.01);
(Continued)

(58) Field of Classification Search
CPC .. G06F 1/1637; G06F 1/1686; H04M 1/0264; H04M 1/0266
See application file for complete search history.

(56) References Cited

U.S. PATENT DOCUMENTS 9,806,219 B2 * 10/2017 Benson ................. G06F 1/1686
2004/0157652 A1    8/2004 Yamazaki
(Continued)

FOREIGN PATENT DOCUMENTS

CN    104754203 A    7/2015
CN    105049688 A    11/2015
(Continued)

OTHER PUBLICATIONS

Chinese First office action,Chinese Application No. 201810277792. 5, dated Jul. 5, 2019(18 pages).
(Continued)

*Primary Examiner* — David Bilodeau
(74) *Attorney, Agent, or Firm* — Ladas & Parry LLP

(57) ABSTRACT

A display screen, a terminal display screen assembly, and a mobile terminal are disclosed. The display screen may include a display module; a frame, including a first face and a second face opposite to the first face, and the display module being arranged on the first face; and a positioning structure, arranged on the second face and located around the first through hole. The first through hole has a first sidewall, the first sidewall has a first projection projected on the frame, an outer wall of the positioning structure has a second projection projected on the frame, and the second projection surrounds the first projection.

20 Claims, 6 Drawing Sheets

(52) U.S. Cl.
CPC ........ *G06F 1/1686* (2013.01); *H04M 1/0264* (2013.01); *H04M 1/0266* (2013.01); *H05K 5/03* (2013.01)

(56) References Cited

U.S. PATENT DOCUMENTS

| | | | |
|---|---|---|---|
| 2007/0070189 A1* | 3/2007 | Lee | .............. H04N 7/142 348/14.16 |
| 2011/0134255 A1 | 6/2011 | Kim et al. | |
| 2012/0105400 A1 | 5/2012 | Mathew et al. | |
| 2013/0064537 A1 | 3/2013 | Kao et al. | |
| 2013/0150122 A1 | 6/2013 | Kulas | |
| 2014/0253799 A1 | 9/2014 | Moon et al. | |
| 2016/0011633 A1* | 1/2016 | Watanabe | .............. G06F 1/1637 345/184 |
| 2016/0110149 A1 | 4/2016 | Sirpal et al. | |
| 2016/0179139 A1 | 6/2016 | Ahn et al. | |
| 2017/0003575 A1 | 1/2017 | Rammah et al. | |
| 2018/0262602 A1 | 9/2018 | Zhang | |
| 2019/0243417 A1 | 8/2019 | Cheng | |
| 2019/0302833 A1 | 10/2019 | Cheng | |
| 2019/0306295 A1 | 10/2019 | Cheng | |

FOREIGN PATENT DOCUMENTS

| | | |
|---|---|---|
| CN | 106850894 A | 6/2017 |
| CN | 106936954 A | 7/2017 |
| CN | 106940584 A | 7/2017 |
| CN | 107068902 A | 8/2017 |
| CN | 107241467 A | 10/2017 |
| CN | 107277201 A | 10/2017 |
| CN | 107395808 A | 11/2017 |
| CN | 206640623 U | 11/2017 |
| CN | 107454232 A | 12/2017 |
| CN | 107483692 A | 12/2017 |
| CN | 107809507 A | 3/2018 |
| CN | 107819903 A | 3/2018 |
| CN | 104754203 B | 7/2018 |
| CN | 108632409 A | 10/2018 |
| CN | 208401899 U | 1/2019 |

OTHER PUBLICATIONS

International search report, International Application No. PCT/CN2019/073429, dated Oct. 4, 2019 (9 pages).
Chinese Second office action, Chinese Application No. 201810277792.5, dated May 8, 2019 (21 pages).
European search report, European Application No. 19154213.3, dated Aug. 8, 2019 (7 pages).
Non Final Action, U.S. Appl. No. 16/364,041, dated Nov. 21, 2019 (35 pages).
Final Action, U.S. Appl. No. 16/364,041, dated Apr. 2, 2020 (18 pages).
Notice of Allowance, U.S. Appl. No. 16/364,041, dated Jun. 17, 2020 (16 pages).
European Examination report for European Application No. 19154213.3, dated Nov. 12, 2020 (6 pages).
Indian First Examination Report for Indian Application No. 201914009671, dated Oct. 9, 2020 (5 pages).

* cited by examiner

DISPLAY SCREEN, TERMINAL DISPLAY SCREEN ASSEMBLY, AND MOBILE TERMINAL

CROSS-REFERENCE TO RELATED APPLICATIONS

This is a continuation application of co-pending patent application Ser. No. 16/364,041, filed on Mar. 25, 2019, which claims priorities to Chinese Patent Application Nos. 201820450899.0 and 201810277792.5, all filed on Mar. 30, 2018, the contents of which are herein incorporated by reference in their entireties.

FIELD

The described embodiments relate to terminal technologies, and more particularly, to a display screen, a terminal display screen assembly, and a mobile terminal.

BACKGROUND

With the development of communication technologies, mobile terminals such as smart phones are becoming more and more popular. People use the mobile terminal such as taking pictures, chatting, playing games. Because more and more mobile terminal functions are required, more and more devices are mounted inside the mobile terminal. In particular, the more and more devices are mounted on one side of the mobile terminal where a screen is mounted. Therefore, in a case when a size of the mobile terminal does not change, a display area of a display screen is often sacrificed, so that the display area of the display screen becomes smaller.

SUMMARY

An embodiment of the present disclosure provides a display screen, including: a display module; a frame, comprising a first face and a second face opposite to the first face, and the display module being arranged on the first face; and a positioning structure, arranged on the second face and located around the first through hole. The first through hole has a first sidewall, the first sidewall has a first projection projected on the frame, an outer wall of the positioning structure has a second projection projected on the frame, and the second projection surrounds the first projection.

An embodiment of the present disclosure further provides a terminal display screen assembly, including a display screen and an optical device. The display screen includes: a display module; a frame, comprising a first face and a second face opposite to the first face, and the display module being arranged on the first face; and a positioning structure, arranged on the second face and located around the first through hole. The first through hole has a first sidewall, the first sidewall has a first projection projected on the frame, an outer wall of the positioning structure has a second projection projected on the frame, and the second projection surrounds the first projection. The optical device includes: a first optical portion; and a second optical portion. The first optical portion is arranged in the first through hole, the second optical portion is fixedly coupled to the positioning structure, and the second optical portion is positioned by the positioning structure.

An embodiment of the present disclosure further provides a mobile terminal, including a housing; and a terminal display screen assembly arranged in the housing. The terminal display screen assembly includes a display screen and an optical device. The display screen defines a first through hole penetrating the display screen in a thickness direction of the display screen, and includes: a display module; a frame, comprising a first face and a second face opposite to the first face, and the display module being arranged on the first face; and a positioning structure, arranged on the second face and located around the first through hole. The first through hole has a first sidewall, the first sidewall has a first projection projected on the frame, an outer wall of the positioning structure has a second projection projected on the frame, and the second projection surrounds the first projection. The optical device, includes: a first optical portion; and a second optical portion. The first optical portion is arranged in the first through hole, the second optical portion is fixedly coupled to the positioning structure, and the second optical portion is positioned by the positioning structure.

BRIEF DESCRIPTION OF THE DRAWINGS

In order to clearly illustrate the technical solutions of the present disclosure, the drawings used in the description of the embodiments will be briefly described. It is understood that the drawings described herein are merely some embodiments of the present disclosure. Those skilled in the art may derive other drawings from these drawings without inventive effort.

FIG. 1/ is another structural illustration of a frame shown in FIG. 7.

DETAILED DESCRIPTION

Figure 1:
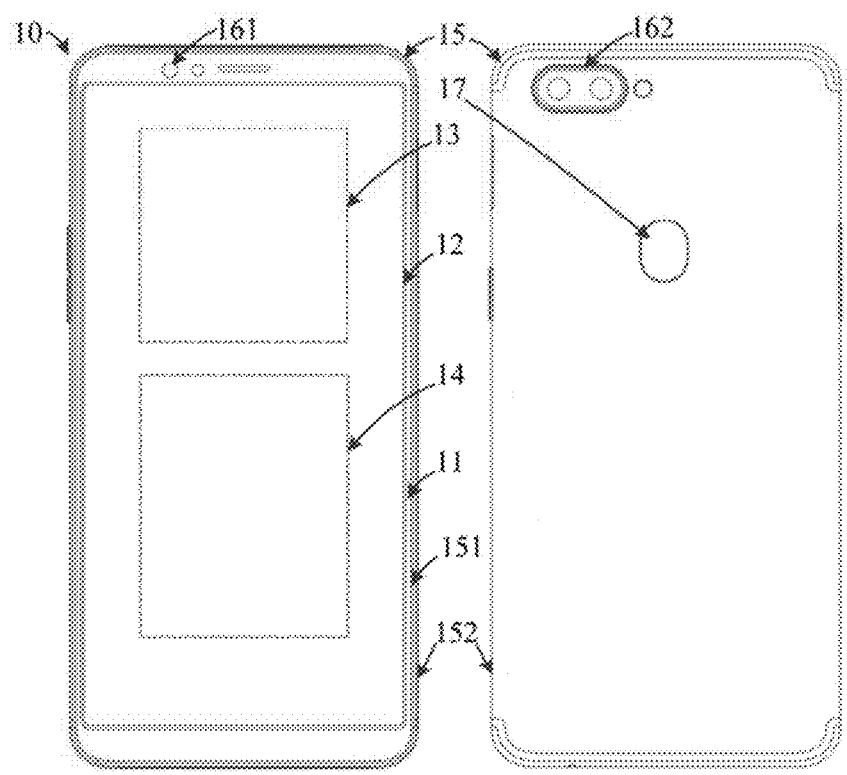
FIG. 1 is a structural illustration of a mobile terminal in accordance with an embodiment in the present disclosure.

The detailed description set forth below is intended as a description of the subject technology with reference to the appended figures and embodiments. It is understood that the embodiments described herein include merely some parts of the embodiments of the present disclosure, but do not include all the embodiments. Based on the embodiments of the present disclosure, all other embodiments that those skilled in the art may derive from these embodiments are within the scope of the present disclosure.

In the description of the present disclosure, it is to be understood that terms such as "center", "longitudinal", "lateral", "length", "width", "thickness", "upper", "lower", "front", "rear", "left", "right", "vertical", "horizontal", "top", "bottom" "inner", "outer", "clockwise", "counter-clockwise", and the like, refer to the orientations and locational relations illustrated in the accompanying drawings. Thus, these terms used here are only for describing the present disclosure and for describing in a simple manner, and are not intended to indicate or imply that the device or the elements are disposed to locate at the specific directions or are structured and performed in the specific directions, which could not to be understood as limiting the present disclosure. In addition, terms such as "first", "second", and the like are used herein for purposes of description, and are not intended to indicate or imply relative importance or significance or to imply the number of indicated technical features. Thus, the feature defined with "first", "second", and the like may include one or more of such a feature. In the description of the present disclosure, "a plurality of" means two or more, such as two, three, and the like, unless specified otherwise.

In the present disclosure, unless specified or limited, otherwise, terms "mounted", "connected", "coupled", and the like are used in a broad sense, and may include, for example, fixed connections, detachable connections, or integral connections; may also be mechanical or electrical connections; may also be direct connections or indirect connections via intervening structures; may also be inner communications of two elements, as can be understood by one skilled in the art depending on specific contexts.

In the present disclosure, unless specified or limited, otherwise, a first feature "upper" or "lower" a second feature may include that the first and second features are in direct contact, and may also include that the first and second features are not in direct contact but are contacted by additional features between them. Moreover, the first feature "above", and "upper" the second feature may include the first feature directly above and oblique above the second feature, or may merely indicate that height of the first feature is greater than height of the second feature. The first feature "below", and "lower" the second feature may include the first feature directly below and oblique below the second feature, or may merely indicate that the height of the first feature is less than the height of the second feature.

The following disclosure provides many different embodiments or examples for implementing different structures of the present disclosure. In order to simplify the present disclosure, components and settings of the specific examples are described below. Of course, embodiments are merely examples and are not intended to limit the present disclosure. In addition, the present disclosure may repeat reference numerals and/or reference numerals in different examples, which are for the purpose of simplicity and clarity, and do not in themselves indicate the relationship between the various embodiments and/or arrangements discussed.

Moreover, the present disclosure provides examples of various specific processes and materials, but one of ordinary skill in the art will recognize the use of other processes and/or the use of other materials.

It should be understood that, the "communication terminal" (also referred to as "terminal") used herein includes, but is not limited to, a device that is configured to receive/transmit communication signals via a wireline connection, such as via a public-switched telephone network (PSTN), digital subscriber line (DSL), digital cable, a direct cable connection, and/or another data connection/network, and/or via a wireless interface with, for example, a cellular network, a wireless local area network (WLAN), a digital television network such as a DVB-H network, a satellite network, an AM-FM broadcast transmitter, and/or another communication terminal. A communication terminal that is set to communicate over a wireless interface may be referred to as a "wireless communication terminal", "wireless terminal" and/or "mobile terminal". Examples of the mobile terminal include, but are not limited to, a satellite or cellular radiotelephone; a Personal Communications System (PCS) terminal that may combine a cellular radiotelephone with data processing, facsimile and data communications capabilities; a PDA that can include a radiotelephone, pager, Internet/intranet access, Web browser, organizer, calendar and/or a global positioning system (GPS) receiver; and a conventional laptop and/or palmtop receiver or other appliance that includes a radiotelephone transceiver.

The present disclosure provides a display screen, a terminal display screen assembly, and a mobile terminal, which will be described below separately in details. The display screen may be mounted in the terminal display screen assembly, and the terminal display screen assembly may be arranged in the mobile terminal. The mobile terminal may be an electronic apparatus such as a smart phone or a tablet computer.

The present disclosure relates to a display screen. The display screen defines a first through hole penetrating the display screen in a thickness direction of the display screen, and includes: a display module; a frame, comprising a first face and a second face opposite to the first face, and the display module being arranged on the first face and a positioning structure, arranged on the second face and located around the first through hole. The first through hole has a first sidewall, the first sidewall has a first projection projected on the frame, an outer wall of the positioning structure has a second projection projected on the frame, and the second projection surrounds the first projection.

In at least one embodiment, the positioning structure extends from the second face of the frame in a direction from the first face towards the second face.

In at least one embodiment, the first sidewall comprises: a first sub-sidewall, arranged on the display module and defining a first sub-through hole penetrating the display module in a thickness direction of the display module; and a second sub-sidewall, arranged on the frame and defining a second sub-through hole penetrating the frame in a thickness direction of the frame; wherein the first through hole comprises the first sub-through hole and the second sub-through hole, and the first sub-through hole communicates with the second sub-through hole. The positioning structure is spaced apart from the second sub-sidewall; or the positioning structure comprises an inner wall opposite to the outer wall, and the inner wall is connected to the second sub-sidewall.

In at least one embodiment, a size of the positioning structure is gradually increased from an end of the positioning structure that is away from the second face to the other end of the positioning structure that contacts with the second face.

In at least one embodiment, the positioning structure is fixed to the non-display face of the display screen by a glue layer.

In at least one embodiment, the positioning structure includes a connecting portion and a positioning portion coupled to each other, the connecting portion is fixedly coupled to the second face, and the positioning portion and the connecting portion are bent to each other.

In at least one embodiment, the connecting portion and the positioning portion are substantially perpendicular to each other, and the positioning portion is adjacent to the first through hole.

In at least one embodiment, the positioning structure further comprises: a first bending portion, connected to the second face and the connecting portion; and a second bending portion, connected between the connecting portion and the positioning portion.

In at least one embodiment, the display screen further comprises at least one of: a first plastic portion, formed on the first bending portion; and a second plastic portion, formed on the second bending portion.

In at least one embodiment, the display screen comprises a display area configured to display a screen of the mobile terminal or configured to be touched by a user, and the first through hole is surrounded by at least a portion of the display area.

In at least one embodiment, the first through hole is a circular hole, and the positioning structure is an annular structure.

In at least one embodiment, the positioning structure includes a plurality of positioning blocks spaced apart from each other.

In at least one embodiment, the display screen includes a frame and a display module.

The frame includes a first face and a second face opposite to the first face. The display module is arranged on the first face of the frame. The frame is made of a metal material, the positioning structure is made of a metal material. The positioning structure is fixedly coupled to the second face of the frame by welding.

The present disclosure further relates to a terminal display screen assembly. The terminal display screen assembly includes a display screen and an optical device. The display screen defines a first through hole penetrating the display screen in a thickness direction of the display screen, and includes: a display module; a frame, comprising a first face and a second face opposite to the first face, and the display module being arranged on the first face; and a positioning structure, arranged on the second face and located around the first through hole. The first through hole has a first sidewall, the first sidewall has a first projection projected on the frame, an outer wall of the positioning structure has a second projection projected on the frame, and the second projection surrounds the first projection. The first optical portion is arranged in the first through hole, the second optical portion is fixedly coupled to the positioning structure, and the second optical portion is positioned by the positioning structure.

In at least one embodiment, the positioning structure extends from the second face of the frame in a direction from the first face towards the second face.

In at least one embodiment, a distance between the first sidewall and the first optical portion is in a range of 0.18 millimeters to 0.4 millimeters.

In at least one embodiment, a size of the positioning structure is gradually increased from an end of the positioning structure that is away from the second face to the other end of the positioning structure that contacts with the second face.

In at least one embodiment, the positioning structure is fixed to the non-display face of the display screen by a glue layer.

In at least one embodiment, the positioning structure includes a connecting portion and a positioning portion coupled to each other, the connecting portion is fixedly coupled to the second face, the positioning portion and the connecting portion are bent to each other, and the positioning portion is fixedly coupled to the second optical portion.

In at least one embodiment, the connecting portion and the positioning portion are substantially perpendicular to each other, and the positioning portion is adjacent to the first through hole.

In at least one embodiment, the positioning structure further comprises: a first bending portion, connected to the second face and the connecting portion; and a second bending portion, connected between the connecting portion and the positioning portion.

In at least one embodiment, the display screen further comprises at least one of: a first plastic portion, formed on the first bending portion; and a second plastic portion, formed on the second bending portion.

In at least one embodiment, the second optical portion is a cylindrical structure, the positioning structure is an annular structure, the positioning structure surrounds the second optical portion; and the positioning structure is fixedly coupled to an outer face of the second optical portion.

In at least one embodiment, the positioning structure includes a plurality of positioning blocks spaced apart from each other, the plurality of positioning blocks surround the second optical portion; and the plurality of positioning blocks are fixedly coupled to an outer face of the second optical portion.

In at least one embodiment, the display screen includes a frame and a display module, the frame includes a first face and a second face opposite to the first face, the display module is arranged on the first face of the frame; and wherein the frame is made of a metal material, the positioning structure is made of a metal material, and the positioning structure is fixedly coupled to the second face of the frame by welding.

In at least one embodiment, the optical device includes a camera module; the camera module includes a lens, a connector, and a base; the lens is arranged in the first through hole; the positioning structure is fixedly coupled to an outer face of the connector; and the lens is mounted on the base by the connector.

In at least one embodiment, the distance between the first sidewall and the first optical portion is about 0.2 millimeters.

The present disclosure further relates to a mobile terminal. The mobile terminal includes: a housing; and a terminal display screen assembly arranged in the housing. The terminal display screen assembly includes a display screen and an optical device. The display screen defines a first through hole penetrating the display screen in a thickness direction of the display screen, and includes: a display module; a frame, comprising a first face and a second face opposite to the first face, and the display module being arranged on the first face; and a positioning structure, arranged on the second face and located around the first through hole. The first through hole has a first sidewall, the first sidewall has a first projection projected on the frame, an outer wall of the positioning structure has a second projection projected on the frame, and the second projection surrounds the first projection. The optical device, includes: a first optical portion; and a second optical portion. The first optical portion is arranged in the first through hole, the second optical portion is fixedly coupled to the positioning structure, and the second optical portion is positioned by the positioning structure.

In at least one embodiment, the terminal display screen assembly is a secondary terminal display screen assembly of the mobile terminal; the mobile terminal includes a main terminal display screen assembly arranged on the housing; a display area of the main terminal display screen assembly is greater than a display area of the secondary terminal display screen assembly; the main terminal display screen assembly is arranged on one side of the housing; and the secondary terminal display screen assembly is arranged on the other side of the housing opposite to the main terminal display screen assembly.

In at least one embodiment, the terminal display screen assembly is a main terminal display screen assembly of the mobile terminal; the mobile terminal includes a secondary terminal display screen assembly arranged on the housing; a display area of the main terminal display screen assembly is greater than a display area of the secondary terminal display screen assembly; the main terminal display screen assembly is arranged on one side of the housing; and the secondary terminal display screen assembly is arranged on the other side of the housing opposite to the main terminal display screen assembly.

In at least one embodiment, the housing comprises a second sidewall defining a second through hole penetrating the housing in a thickness direction of the housing, and the second through hole communicates with the first through hole; the second optical portion is fixedly connected to the second sidewall.

In at least one embodiment, a diameter of the second through hole is greater than a diameter of the first through hole.

The present disclosure further relates to a mobile terminal. The mobile terminal includes: a housing; and a terminal display screen assembly arranged in the housing. The terminal display screen assembly includes: a display screen, a housing, and an optical device. The display screen includes: a first through hole penetrating the display screen in a thickness direction of the display screen; and a first sidewall located at a position of the first through hole, the first sidewall surrounding and defining the first through hole. The housing includes: a second through hole penetrating the housing in a thickness direction of the housing; and a second sidewall located at a position of the second through hole, the second sidewall surrounding and defining the second through hole. The display screen is mounted on the housing; and the first through hole and the second through hole extend to each other. The optical device includes: a first optical portion; and a second optical portion. The first optical portion is arranged in the first through hole, a distance between the first optical portion and the first sidewall is about 0.4 millimeters, the second optical portion is arranged in the second through hole, and the second optical portion is fixedly coupled to the second sidewall.

FIG. 1 is a structural illustration of a front side and a back side of a mobile terminal in accordance with an embodiment in the present disclosure. The mobile terminal 10 may include a cover plate 11, a display screen 12, a circuit board 13, a battery 14, a housing 15, a front camera 161, a rear camera 162, and a fingerprint unlocking module 17. It should be noted that, the mobile terminal 10 may be not limited to the above-mentioned devices, and may include other devices, or may not include the rear camera 16, or may not include the fingerprint unlocking module 17 and the like.

The cover plate 11 may be mounted on the display screen 12, to cover the display screen 12. The cover plate 11 may be a transparent glass cover, so that the display may be displayed through transparent cover plate 11. In some embodiments, the cover plate 11 may be a glass cover made of a material such as sapphire.

The housing 15 may define an outer contour of the mobile terminal 10. In some embodiments, the housing 15 may include a middle frame 151 and a rear cover plate 152. The middle frame 151 and the rear cover plate 152 may be combined with each other to define the housing 15. The middle frame 151 and the rear cover plate 152 may define a storage space, to receive the circuit board 13, the display screen 12, the battery 14, and the like. In some embodiments, the cover plate 11 may be arranged to cover the middle frame 151. The rear cover plate 152 may be arranged to cover the middle frame 151. The cover plate 11 and the rear cover plate 152 may be located on opposite sides of the middle frame 151. The cover plate 11 and the rear cover plate 152 may be arranged opposite to each other.

In some embodiments, the housing 15 may be a metal housing made of a metal such as magnesium alloy, stainless steel, or the like. It should be noted that, the material of the housing 15 of this embodiment in the present disclosure is not limited herein, and it may also adopt other material. For example, the housing 15 may be a plastic housing. Also, for example, the housing 15 may be a ceramic housing. For another example, the housing 15 may include a plastic portion and a metal portion, and the housing 15 may be a housing structure with metal and plastic matching to each other. Specifically, the metal portion may be formed before the plastic portion. For example, a magnesium alloy substrate may be formed by an injection molding method, and plastic may be molded on the magnesium alloy base to form a plastic substrate, thereby a complete housing structure may be formed.

It should be noted that, the structure of the housing of the embodiment in the present disclosure is not limited herein. For example, the rear cover plate and the middle frame may be integrally formed to form the housing 15 structure, and the housing may directly have a storage space configured to receive the circuit board 13, the display screen 12, the battery 14 and other devices.

The circuit board 13 may be mounted in the housing 15. The circuit board 13 may be a mother board of the mobile terminal 10. The circuit board 13 may be integrated with one, two or more of functional devices such as a motor, a microphone, a loudspeaker, a headphone interface, a universal serial bus interface, the front camera 161, the rear camera 162, a distance sensor, an ambient light sensor, a receiver, and a processor.

In some embodiments, the circuit board 13 may be fixed in the housing 15. Specifically, the circuit board 13 may be screwed to the middle frame 151 by screws, or may be snapped onto the middle frame 151 by buckles. It should be noted that, in embodiments of the present disclosure, how to fix the circuit board 13 on the middle frame 151 is not limited herein, it may also fix in other ways, such as by snaps and screws together.

The battery 14 may be mounted in the housing 15. The battery 14 may be electrically coupled to the circuit board 13, to supply power to the mobile terminal 10. The housing 15 may serve as a battery cover for the battery 14. The housing 15 may cover the battery 14 to protect the battery 14. In particular, the rear cover plate may cover the battery 14 to protect the battery 14, and damages of the battery 14 due to colliding, dropping, or the like, to the mobile terminal 10, may be reduced.

The display screen 12 may be mounted in the housing 15, and the display screen 12 may be electrically coupled to the circuit board 13 to define a display face of the mobile terminal 10. The display screen 12 may include a display area and a non-display area. The display area may be configured to display a screen of the mobile terminal 10, or may be configured to be touched by a user to touch manipulate, or the like. An opening may be defined in a top portion of the non-display area. The opening may be configured to transmit sound and light. A functional device such as a fingerprint module and a touch button may be arranged on a bottom portion of the non-display area. The cover plate 11 may be mounted on the display screen 12 to cover the display screen 12. The cover plate 11 may be defined a same display area and a same non-display area as the display screen 12, or may be defined a different display area and a different non-display area as the display screen 12.

In some embodiments, the display screen 12 may be a display screen of a type such as a liquid crystal display (LCD) screen or an organic light-emitting diode (OLED) display screen. In some embodiments, when the display screen 12 is the LCD screen, the display screen 12 may include a backlight module, a lower polarizer, an array substrate, a liquid crystal layer, a color filter substrate, and an upper polarizer. When the display screen 12 is the OLED display screen, the display screen 12 may include a base substrate, an anode layer, an organic layer, a conductive layer, a light-emitting layer, and a cathode layer, which are sequentially stacked. In some embodiments, the display screen 12 may be a transparent display screen or a non-transparent display screen.

It should be noted that, the structure of the display screen 12 is not limited herein. For example, the display screen 12 may be a profiled screen.

Figure 2:
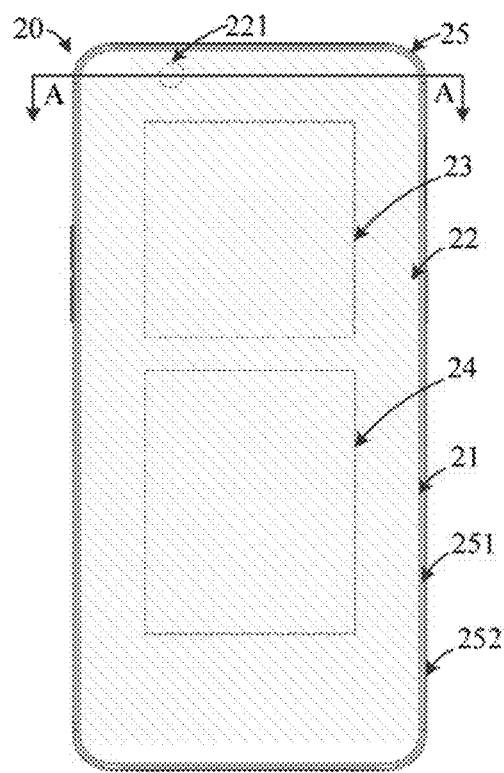
FIG. 2 is another structural illustration of a mobile terminal in accordance with an embodiment in the present disclosure.

FIG. 2 is another structural illustration of a mobile terminal in accordance with an embodiment in the present disclosure. The mobile terminal 20 may include a cover plate 21, a display screen 22, a circuit board 23, a battery 24, and a housing 25. In some embodiments, the housing 25 may include a middle frame 251 and a rear cover plate 252. The middle frame 251 and the rear cover plate 252 may be combined with each other to define the housing 25. The mobile terminal 20 may differ from the mobile terminal 10 in that, the display screen 22 may be directly defined with a light transmission area 221. For example, a first through hole 221 may be defined in the display screen 22 and penetrating the display screen 22 in a thickness direction, i.e., the light transmission area may be the first through hole 221. A front camera, a loudspeaker, a sensor, an optical device, and the like, may be arranged in the first through hole 22, to transmit signals. The cover plate 21 may cover the first through hole 221, or may define an opening corresponding to the first through hole.

Figure 3:
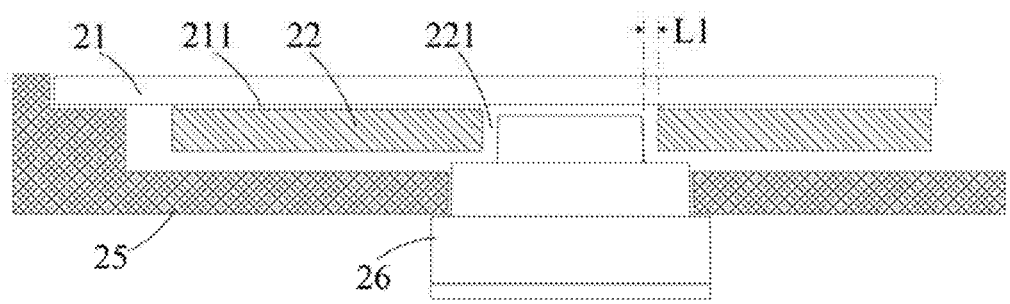
FIG. 3 is a partial cross-sectional view of a mobile terminal shown in FIG. 2 in section of an A-A direction.
Figure 4:
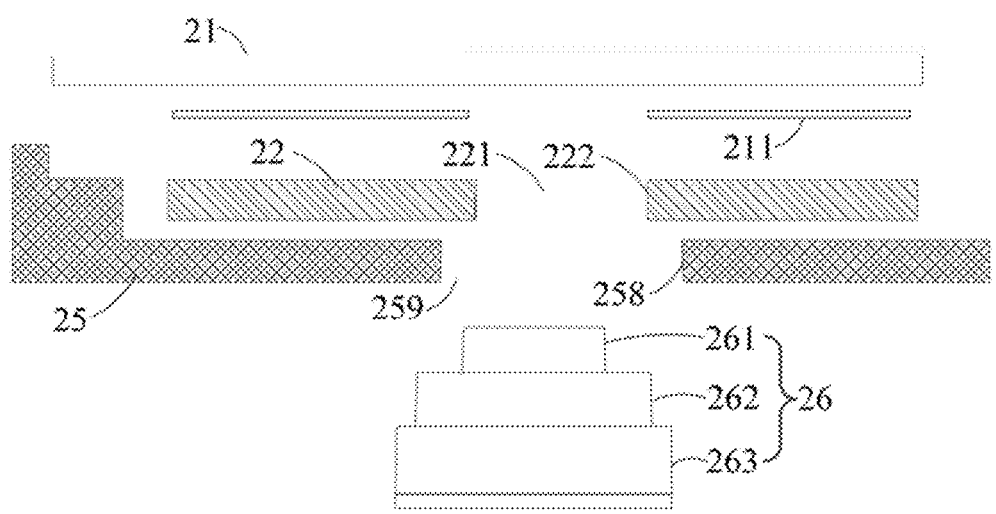
FIG. 4 is an explored view of a mobile terminal shown in FIG. 3.

FIG. 3 illustrates a partial cross-sectional view of a mobile terminal shown in FIG. 2 in section of an A-A direction. FIG. 4 illustrates an explored view of a mobile terminal shown in FIG. 3. The mobile terminal 20 may include an optical device 26 mounted at a position of the first through hole 221.

The optical device 26 may include a first optical portion 261, a second optical portion 262, and a third optical portion 263. The first optical portion 261 may be mounted on the third optical portion 263 by the second optical portion 262. The first optical portion 261 may be mounted in the first through hole 221. The second optical portion 262 may be positioned by the housing 25. The third optical portion 263 may be matched with other devices. It should be noted that, in some other embodiments, the optical device may not include the third optical portion 263, but may include only the first optical portion 261 and the second optical portion 262. The first optical portion 261 may be directly mounted on the second optical portion 262.

In some embodiments, the optical device 26 may be a camera module. The camera module may be described by taking the camera as an example. In some embodiments, the camera may include a lens, a connector, and a base, i.e., the first optical portion 261 may be the lens, the second optical portion 262 may be the connector, the third optical portion 263 may be the base, and the lens may be mounted on the base by the connector. In other embodiments, the camera may not also include the connector or the base. The lens may be mounted directly on the connector or on the base.

A lens of the camera may be at least partially received in the first through hole 221. The camera may be directly integrated on the circuit board 23, or may be electrically coupled to the circuit board 23 by a signal line. The circuit board 23 may be mounted in the housing 25. The circuit board 23 may be electrically coupled to the battery 24. The cover plate 21 may be arranged on the display screen 22. The cover plate may cover the first through hole 221. The housing 25 may be referred to the above-mentioned housing 15. The circuit board 23 may be referred to the above-mentioned circuit board 13. The battery 24 may be referred to the above-mentioned battery 14. Therefore, no additional description is given herein.

In some embodiments, the first through hole 221 may be one, two or more. The first through hole 221 may be close to an edge of the display screen 22. For example, the first through hole 221 may be close to one end of the display screen 22. The first through hole 221 may also be close to other portions of the display screen 22. For example, the first through hole 221 may be close a side of the display screen 22, or the first through hole 221 may be close to a corner of the display screen 22, or the first through hole 221 may be located at an intermediate portion of the display screen 22. The first through hole 221 may be a circular hole or a rectangular hole, and the first through hole 221 may be other shapes, such as an irregular hole.

In this embodiment in the present disclosure, the camera may realize photographing and taking pictures by the first through hole 221, and it may not need to arrange an additional camera on the mobile terminal. In this embodiment in the present disclosure, the display screen 22 may cover peripheral positions of the housing 25, compared with a camera arranged on the non-display area at an edge of the display screen (as shown in FIG. 1), in a case when a size of the mobile terminal does not change, the display area of the display screen may be increased.

In some embodiments, the display screen 22 may have a first sidewall 222 at a position of the first through hole 221. The first sidewall 222 may surround and define the first through hole 221. The lens may be placed in the first through hole 221. In order to protect the lens and the display screen 22, the lens and the first sidewall 222 may be spaced apart from each other to maintain a safe distance, so that the lens in the first through hole 221, and the first sidewall 222 may be prevented from colliding to each other. In some embodiments, a distance L1 between the lens and the first sidewall 222 may be set to about 0.4 millimeters.

In an actual development process, the lens itself has tolerance. The camera is fixed by the housing 25, and tolerance between the housing 25 and the camera exists, and the display screen has tolerance, so that tolerance chain between the lens and the first sidewall 222 is occurred, and the tolerance chain is greater. With total of each tolerance become greater, it is necessary to reserve a sufficient space between the lens and the first sidewall 222. The additional reserved space not only occupies a display area of the display screen 22, but also increases diameter of the first through hole 221, so that security of the display screen is reduced and a black side at the position of the first through hole 221 is increased. It affects the appearance of a display face of the display screen 22, and is not easy for users to use.

Therefore, in this embodiment in the present disclosure, the distance L1 between the lens and the first sidewall 222 may be controlled to be about 0.4 millimeters. In a case of no colliding between the lens and the first sidewall 222, the diameter of the first through hole 221 may be reduced, and the display area of the display screen 22 may be increased.

In some embodiments, the camera may be positioned by the housing 25. Specifically, a second through hole 259 may be defined in the housing 25, and may penetrate the housing 25 in a thickness direction of the housing 25. The second sidewall 258 may surround and define the second through hole 259. The second through hole 259 and the first through hole 221 may extend to each other. Diameter of the second through hole 259 may be greater than the diameter of the first through hole 221. The second through hole 259 may be a circular hole, a rectangular hole, or other shapes. When the camera is mounted, the lens of the camera may be placed in the first through hole 221, and the connector of the camera may be placed in the second through hole 259, and the connector may be fixedly coupled by the second sidewall 258, to align the camera on the housing 25. It should be noted that, a positioning structure may also be arranged at a position of the second sidewall 258 to further align the connector.

It should be noted that, in a case of maintaining a safe distance between the lens and the first sidewall 222 to reduce the diameter of the first through hole 221, it is not limited to set the distance L1 between the lens and the first sidewall 222 to about 0.4 millimeters.

Figure 5:
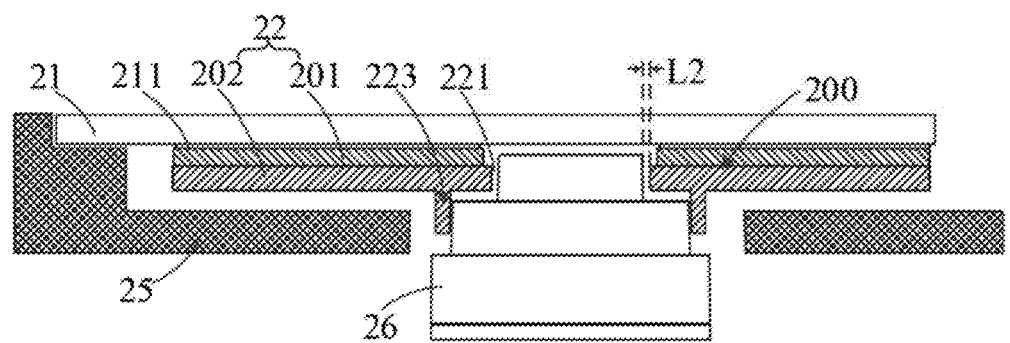
FIG. 5 is another partial cross-sectional view of a mobile terminal shown in FIG. 2 in section of an A-A direction.

FIG. 5 illustrates a partial cross-sectional view of a mobile terminal shown in FIG. 2 in section of an A-A direction. Difference between the mobile terminal shown in FIG. 5 and the mobile terminal shown in FIG. 3 is that, the camera of the mobile terminal in FIG. 5 may be positioned by the display screen 22, so that the tolerance between the housing 25 and the camera to each other may be reduced. Further, the tolerance chain between the camera and the first sidewall 222 at the position of the first through hole 221 of the display screen 22 may be reduced, and the tolerance between the camera and the first sidewall 222 may be reduced. In the case when a size of the lens of the camera is constant, the diameter of the first through hole 221 may be reduced, the display area of the display screen 22 may be increased, and the black side at the position of the first through hole 221 may be reduced. The camera and the display screen 22 may be assembled to each other and assembled into a display screen assembly 200. To further describe a fixedly coupled relationship between the camera and the display screen 22, the display screen assembly 200 will be described in following.

Figure 6:
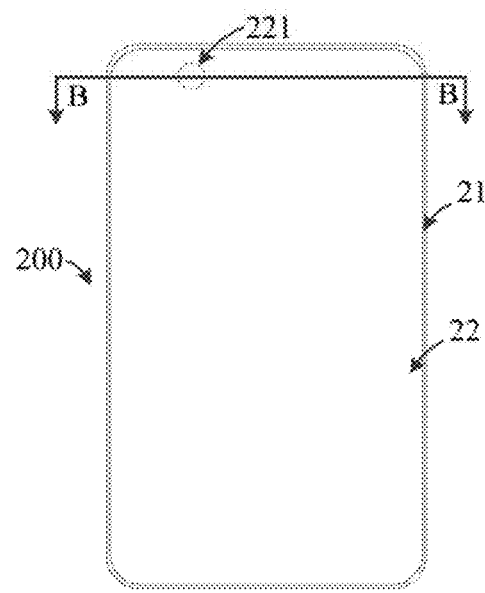
FIG. 6 is a structural illustration of a display screen assembly in accordance with an embodiment in the present disclosure.
Figure 7:
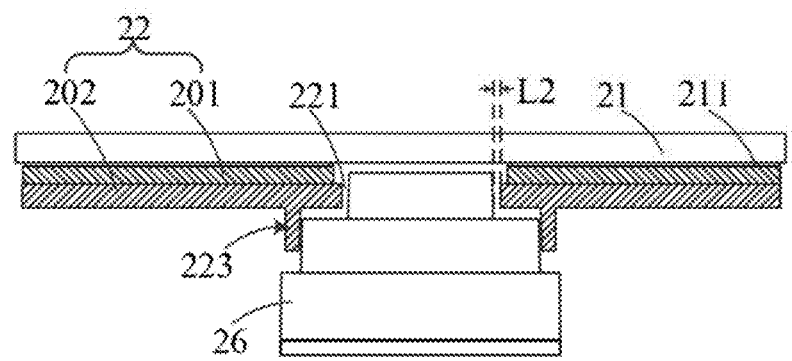
FIG. 7 is a cross-sectional view of a display screen assembly shown in FIG. 6.
Figure 8:
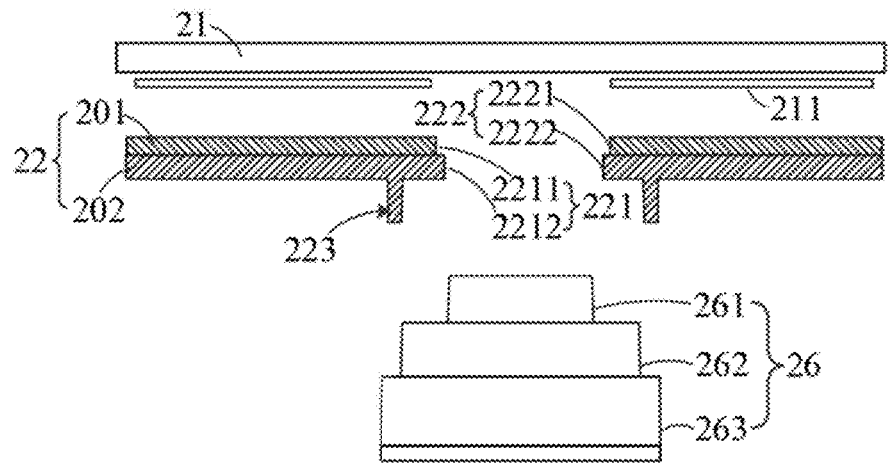
FIG. 8 is an explored view of a display screen assembly shown in FIG. 7.

FIG. 6 is a structural illustration of a display screen assembly in accordance with an embodiment in the present disclosure. FIG. 7 illustrates a cross-sectional view of a display screen assembly shown in FIG. 6 in section of a B-B direction. FIG. 8 illustrates an explored view of a display screen assembly shown in FIG. 7. The display screen assembly 200 may include a cover plate 21, a display screen 22, and a camera.

The cover plate 21 may be a transparent cover. The cover plate 21 may be fixedly coupled to the display screen 22 by an optical adhesive 211.

Figure 9:
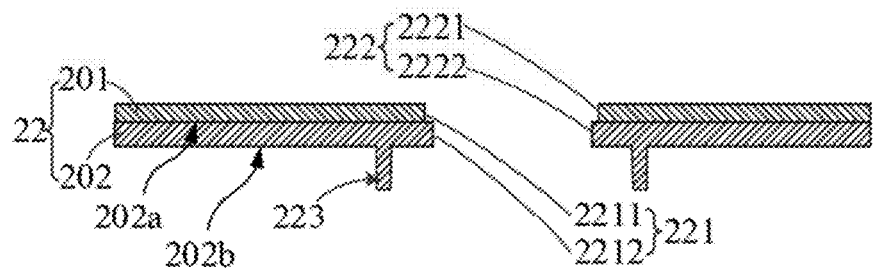
FIG. 9 is a structural illustration of a display screen in accordance with an embodiment in the present disclosure.

A first through hole 221 may be defined in the display screen 22 and penetrating the display screen 22 in a thickness direction. The first through hole 221 may refer to the above-mentioned first through hole 221, therefore no additional description is given herein. The display screen 22 may have a first sidewall 222 at a position of the first through hole 221. The first sidewall 222 may surround and define the first through hole 221. In some embodiment, referring to FIG. 9, FIG. 9 is a structural illustration of a display screen in accordance with an embodiment in the present disclosure. The display screen 22 may include a display module 201 and a frame 202.

The display module 201 may be configured to display. The display module 201 may have a display face and a non-display face opposite to each other. The display module 201 may be configured to display on the display face. The display face and the cover plate 21 may be arranged in a stacked manner. The display face may be arranged toward an outer direction of the mobile terminal 20. The non-display face of the display module 201 may not be configured to display. The non-display face may be located inside the mobile terminal 20. More specifically, the frame 202 may include a first face 202a (also called as "outer face") and a second face 202b (also called as "inner face") opposite to the first face 202a. The non-display face of the display module 201 may be stacked on the inner face 202b of the frame 202. The frame 202 may be configured to bear and protect the display module 201.

The frame 202 may be made of a metal material, or may be made of composite with metal and plastic. It should be noted that, the frame 202 may also be made of a plastic material or other materials. The inner face 202b of the frame 202 and the display module 201 may be arranged in a stacked manner. The non-display face of the frame 202 may be fixedly coupled to the housing 25.

The first through hole 221 may include a first sub-through hole 2211 defined in the display module 201. The first sub-through hole 2211 may penetrate the display module 201 in a thickness direction of the display module 201. The first through hole 221 may include a second sub-through hole 2212 defined in the frame, and the second sub-through hole 2212 may penetrate the frame 202 in a thickness direction of the frame 202. The first sub-through hole 2211 and the second sub-through hole 2212 may extend to each other to define the first through hole 221.

The first sidewall 222 may include a first sub-sidewall 2221 arranged on the display module 201. The first sub-sidewall 2221 may be located at a position of the first through hole 2211. The first sub-sidewall 2221 may surround and define the first sub-through hole 2211. The first sidewall 222 may include a second sub-sidewall 2222 arranged on the frame 202. The second sub-sidewall 2222 may be located at a position of the second sub-through hole

2212. The second sub-sidewall 2222 may surround and define the second sub-through hole 2212.

The camera may be a type of optical device. The camera may be replaced by other optical devices, or the camera may be integrated with other optical devices. It should be noted that, the camera may refer to the above-mentioned description, therefore no additional description is given herein.

In some embodiments, the lens of the camera may be arranged in the first through hole 221, or the lens may be arranged in the first sub-through hole 2211 and the second sub-through hole 2212. The connector of the camera may be fixedly coupled to a positioning structure 223 on an outer face 202*a* of the frame 202. The connector may be positioned by the positioning structure 223 on the outer face 202*a* of the frame 202, to fixedly couple the camera and the display screen 22.

The lens may be a cylindrical structure. The lens may also be a circular body structure. The lens may further be a cuboid structure. It should be noted that, the structure of the lens is not limited herein. A shape of the first through hole 221 may be adapted to a shape of the lens.

The connector and the lens may be coupled. The connector may be a cylindrical structure. The connector may also be a circular body structure. The connector may further be a cuboid structure. It should be noted that, the structure of the connector is not limited herein.

The base 263 may be coupled to the connector. The lens may be mounted on the base 263 by the connector. The base 263 may be mounted inside the mobile terminal 20, or may be matched with other devices, such as a housing or the like. It should be noted that, the camera may also include only the lens and the connector, and may not include the base 263, and the connector may serve as the base of the lens.

In some embodiments, a positioning structure 223 may be arranged on an outer face 202*a* of the frame 202. The positioning structure 223 may be fixedly coupled to the connector, to align the camera. A shape of the positioning structure 223 may be adapted to a shape of the connector. For example, the positioning structure 223 may be a ring structure. For another example, the positioning structure 223 may be a cuboid structure or the like. It should be noted that, the positioning structure 223 may also be arranged as other structures. For example, the positioning structure 223 may include a plurality of spaced positioning blocks. A fixedly coupled relationship of the connector may be realized by the plurality of spaced positioning blocks.

In some embodiments, the positioning structure 223 may surround the first through hole 221, or the positioning structure 223 may surround the second sub-through hole 2212. Herein, the positioning structure 223 may include an outer wall 223*a* and an inner wall 223*b* opposite to the outer wall 223*a*. The first sidewall 222 may have a first projection projected on the frame 202, and the outer wall 223*a* may have a second projection projected on the frame 202. The second projection surrounds the first projection.

Figure 10:
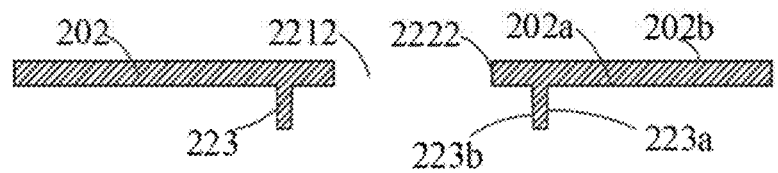
FIG. 10 is a structural illustration of a frame shown in FIG. 7.

The positioning structure 223 may be directly coupled to the second sub-sidewall 2222 or may be spaced apart from the second sub-sidewall 2222. In some embodiments, the positioning structure 223 may be integrally coupled to the frame 202. Referring to FIG. 10, FIG. 10 is a structural illustration of a frame shown in FIG. 7. The positioning structure 223 may be formed directly by extending outward from the outer face 202*a* of the frame 202, or the positioning structure 223 may be formed directly by extending outward from the outer face 202*a* of the frame 202 in a direction of an inner face 202*b* of the frame 202 toward the outer face 202*a*. The positioning structure 223 and the second sub-sidewall 2222 may be spaced apart from each other. The positioning structure 223 may be set according to a size of the connector. The positioning structure 223 and the frame 202 may be formed by a metal material injection molding method, or may be formed by welding.

Figure 11:
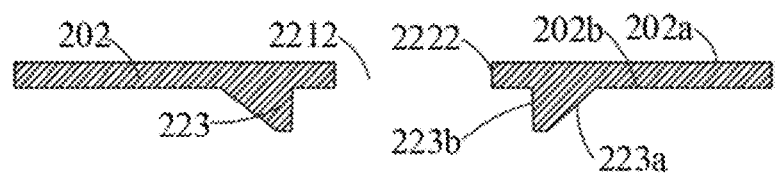

FIG. 11 is another structural illustration of a frame shown in FIG. 7. A size of the positioning structure 223 from a free end of the positioning structure 223 to the other end of the positioning structure 223 may be gradually increased. Strength of the positioning structure 223 may be increased, to ensure strength that the positioning structure 223 may be fixedly coupled to the camera. Herein, a size of the positioning structure 223 may refer to an area of a cross section of the positioning structure 223 taken along a plane substantially perpendicular to the second sub-sidewall 2222.

Figure 12:
FIG. 12 is another structural illustration of a frame shown in FIG. 7.

FIG. 12 is another structural illustration of a frame shown in FIG. 7. The positioning structure 223 may be formed by extending along the second sub-sidewall 2222 from the inner face 202*b* of the frame 202 toward the outer face 202*a* of the frame 202. The positioning structure 223 may include a first bending portion 2231, a connecting portion 2232, a second bending portion 2233, and a positioning portion 2234 which are integrally and sequentially arranged.

The first bending portion 2231 may be coupled between the second sub-sidewall 2222 and the connecting portion 2232. The connecting portion 2231 and the frame 202 may be bent to each other to form the first bending portion 2231. The first bending portion 2231 may be close to the second sub-through hole 2212.

The connecting portion 2233 may be in contact with the outer face 202*a* of the frame 202, and may be fixedly coupled the frame 202. For example, the connecting portion 2233 may be fixedly coupled the frame 202 by glue bonding or by welding.

The second bending portion 2233 may be coupled between the connecting portion 2232 and the positioning portion 2234. The positioning portion 2234 and the connecting portion 2232 may be bent to each other to form second bending portion 2233. The second bending portion 2233 may be away from the second sub-through hole 2212.

The positioning portion 2234 may be fixedly coupled to the connecting body 262. The positioning portion 2234 and the connecting portion 2232 may be disposed substantially perpendicular to each other, or may form an angle of less than or greater than 90 degrees with each other.

Figure 13:
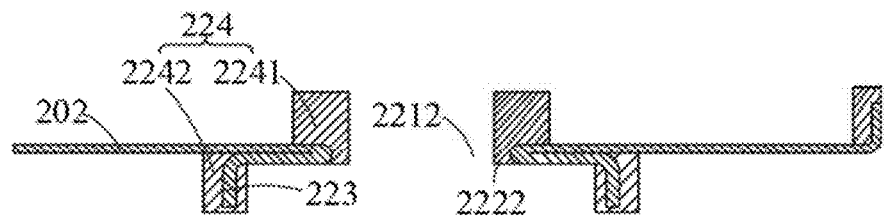
FIG. 13 is another structural illustration of a frame shown in FIG. 7.

FIG. 13 is another structural illustration of a frame shown in FIG. 7. A plastic portion 224 may be arranged on the positioning structure 223. The plastic portion 224 may be made of a plastic material. The plastic portion 224 can be formed on the positioning structure 223 by an abrasive injection molding method. The plastic portion 224 may include a first plastic portion 2241 and a second plastic portion 2242. The first plastic portion 2241 may be formed on the first bending portion 2231 by an injection molding method, to increase strength of the first bending portion 2231. The second plastic portion 2242 may be formed on the second bending portion 2233 by an injection molding method, or the second plastic portion 2242 may be formed on the second bending portion 2233 and the positioning portion 2243 by an injection molding method, to increase strength of the second bending portion 2233 and the positioning portion 2234.

Figure 14:
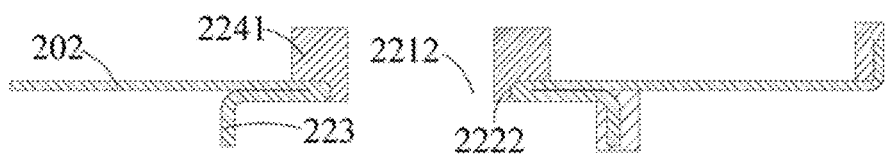
FIG. 14 is another structural illustration of a frame shown in FIG. 7.

It should be noted that, a structure of the plastic portion 224 is not limited herein. For example, FIG. 14 is another structural illustration of a frame shown in FIG. 7. The plastic portion 224 may include only the first plastic portion 2241. The first plastic portion 2241 may be formed on the first bending portion 2231 by an injection molding method, to increase the strength of the first bending portion 2231.

Figure 15:
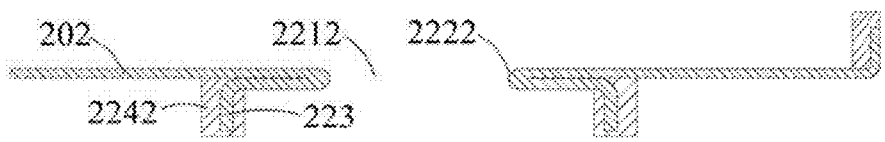
FIG. 15 is another structural illustration of a frame shown in FIG. 7.

FIG. 15 is another structural illustration of a frame shown in FIG. 7. The plastic portion 224 may include only the second plastic portion 2242. The second plastic portion 2242 may be formed on the second bending portion 2233 by an injection molding method, or may be formed on the second bending portion 2233 and the positioning portion 2243, to increase the strength of the second bending portion 2233 and the positioning portion 2234.

Figure 16:
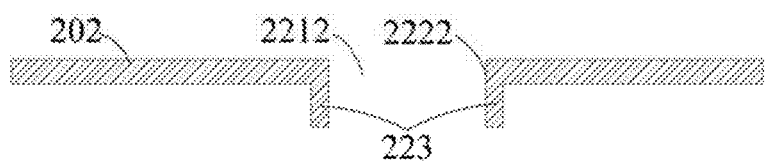
FIG. 16 is another structural illustration of a frame shown in FIG. 7.

FIG. 16 is another structural illustration of a frame shown in FIG. 7. The inner wall 223b of the positioning structure 223 may be connected to the second sub-sidewall 2222. More specifically, the positioning structure 223 may be formed directly by extending along the second sub-sidewall 2222 from the inner face 202b of the frame 202 toward the outer face 202a of the frame 202.

Figure 17:
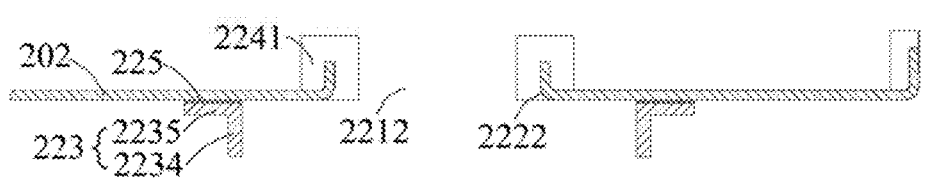
FIG. 17 is another structural illustration of a frame shown in FIG. 7.

It should be noted that, the positioning structure 223 may also be fixedly coupled to the frame 202 in other manners. Referring to FIG. 17, FIG. 17 is another structural illustration of a frame shown in FIG. 7. The positioning structure 223 may be fixedly coupled to the frame 202 by a glue layer 225. The glue layer 225 may be made of glue. The positioning structure 223 may include the integrally coupled connecting portion 2235 and the positioning portion 2234. The connecting portion 2235 and the positioning portion 2234 may be bent to each other. The connecting portion 2235 and the positioning portion 2234 may be substantially perpendicular to each other. The connecting portion 2235 and the positioning portion 2234 may be form a L-shaped structure. The connecting portion 2235 may be fixedly coupled to the frame 202 by the glue layer 225. The positioning portion 2234 may be fixedly coupled to the connecting body 262 of the camera. The positioning portion 2234 may be close to the first through hole 221, or the positioning portion 2234 may be close to the second sub-through hole 2212. It should be noted that, the connecting portion 2235 may also be fixed to the frame 202 by other manners, such as welding. It should also be noted that, the positioning structure 223 may not include the connecting portion 2235, but may include only the positioning portion 2234.

In embodiments of the present disclosure, when the camera is mounted in the first through hole 221 of the display screen 22, the positioning structure 223 may align the camera, and the distance L2 between the lens of the camera and the first sidewall 222 may be in a range of 0.18 to 0.4 millimeters. In an actual production process, in a case of preventing the lens 221 and the first sidewall 222 from colliding, the distance L2 between the lens and the first sidewall 222 may be set to about 0.2 millimeters. Thereby, the size of the first through hole 221 may be reduced.

In embodiments of the present disclosure, the camera may be directly positioned by the positioning structure 223 of the display screen 22, so that the tolerance between the housing 25 and the camera to each other may be reduced. Further, tolerance chain between the camera and the first sidewall 222 at the position of the first through hole 221 of the display screen 22 may be reduced, and the tolerance between the camera and the first sidewall 222 may be reduced. In the case when a size of the lens of the camera is constant, the diameter of the first through hole 221 may be reduced, the display area of the display screen 22 may be increased, and the black side at the position of the first through hole 221 may be reduced.

It should be noted that, the structure of the display screen 22 is not limited herein.

Figure 18:
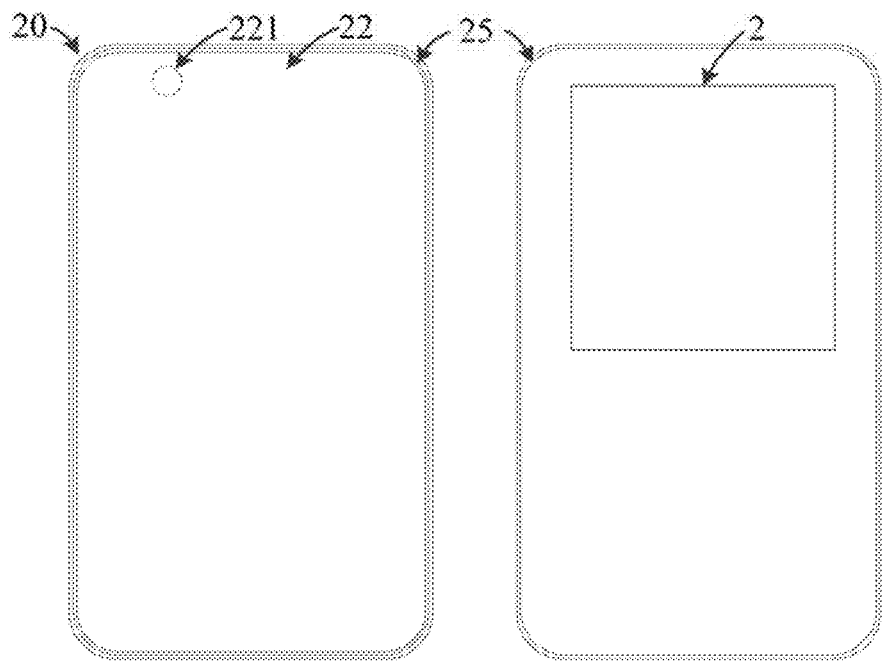
FIG. 18 is another structural illustration of a mobile terminal in accordance with an embodiment in the present disclosure.

FIG. 18 is another structural illustration of a front side and a back side of a mobile terminal in accordance with an embodiment in the present disclosure. The mobile terminal 20 may differ from the above-mentioned mobile terminal in that, the mobile terminal 20 may include a main terminal display screen assembly 200 and a secondary terminal display screen assembly 2. The main terminal display screen assembly 20 may be mounted on one side of the housing 25, and the secondary terminal display screen assembly 2 may be mounted on the other side of the housing 25. The main terminal display screen assembly 200 and the secondary terminal display screen assembly 2 may be arranged on opposite sides of the housing 25, respectively. In some embodiments, the display area in the main terminal display screen assembly 200 may be greater than the display area in the secondary terminal display screen assembly 2. In some embodiments, a first through hole 221 may be defined in the main terminal display screen assembly 200. Detailed descriptions may refer to the above-mentioned terminal display screen assembly 200, therefore no additional description is given herein. The secondary terminal display screen assembly 2 may include a display screen and a cover plate. The display and the cover plate may be referred to the above-mentioned descriptions.

Figure 19:
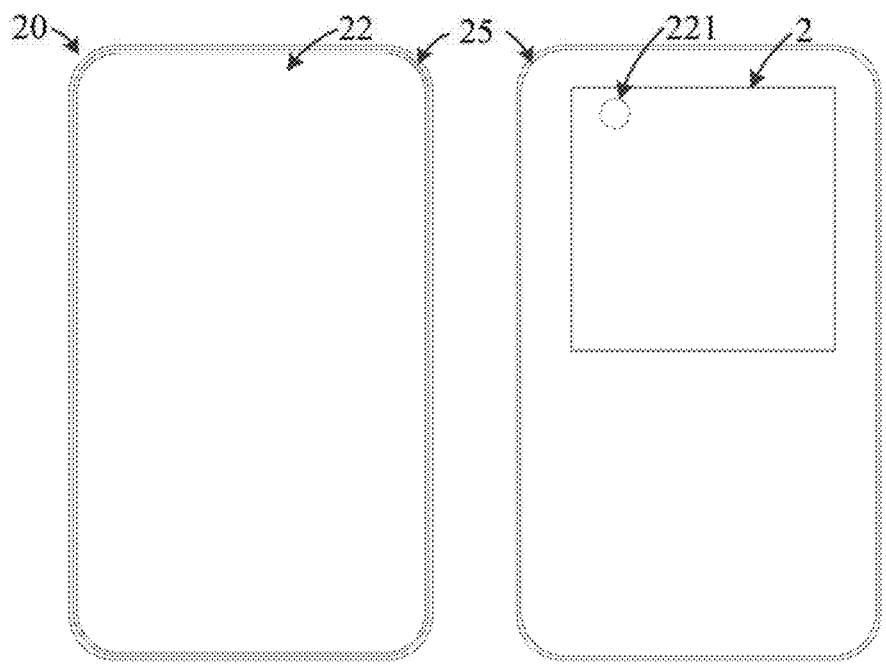
FIG. 19 is another structural illustration of a mobile terminal in accordance with an embodiment in the present disclosure.

It should be noted that, the first through hole 221 may also be defined in the secondary terminal display screen assembly 2. Referring to FIG. 19, FIG. 19 is another structural illustration of a front side and a back side of a mobile terminal in accordance with an embodiment in the present disclosure. The mobile terminal 200 as shown in FIG. 19 may differ from the mobile terminal 200 as shown in FIG. 19 in that, the main terminal display screen assembly 200 may not include the first through hole 221, and the first through hole 221 may be defined in the secondary terminal display screen assembly 2. A structure of the secondary terminal display screen assembly 2 may be referred to the above-mentioned descriptions, therefore no additional description is given herein.

The display screen, the terminal display screen assembly, and the mobile terminal according to the embodiments of the present disclosure are described above in detail. Specific examples are employed in the present disclosure to illustrate the principles and embodiments of the present disclosure. The above description of the embodiments is simply made to facilitate understanding the present disclosure. Meanwhile, one skilled in the art may make any modifications to the specific embodiments and application scope based on the idea of the present disclosure. In sum, the contents set forth in the present description shall not be construed as limiting the present disclosure.

What is claimed is:

1. A display screen, defining a first through hole penetrating the display screen in a thickness direction of the display screen, and comprising:
   a display module;
   a frame, comprising a first face and a second face opposite to the first face, and the display module being arranged on the first face; and
   a positioning structure, arranged on the second face and located around the first through hole:
   wherein the first through hole has a first sidewall, the first sidewall has a first projection projected on the frame, an outer wall of the positioning structure has a second projection projected on the frame, and the second projection surrounds the first projection.

2. The display screen according to claim 1, wherein the positioning structure extends from the second face of the frame in a direction from the first face towards the second face.

3. The display screen according to claim 2, wherein the first sidewall comprises:
a first sub-sidewall, arranged on the display module and defining a first sub-through hole penetrating the display module in a thickness direction of the display module; and
a second sub-sidewall, arranged on the frame and defining a second sub-through hole penetrating the frame in a thickness direction of the frame; wherein the first through hole comprises the first sub-through hole and the second sub-through hole, and the first sub-through hole communicates with the second sub-through hole;
wherein the positioning structure is spaced apart from the second sub-sidewall; or
the positioning structure comprises an inner wall opposite to the outer wall, and the inner wall is connected to the second sub-sidewall.

4. The display screen according to claim 1, wherein a size of the positioning structure is gradually increased from an end of the positioning structure that is away from the second face to the other end of the positioning structure that contacts with the second face.

5. The display screen according to claim 1, wherein the positioning structure comprises a connecting portion and a positioning portion coupled to each other, the connecting portion is fixedly coupled to second face, and the positioning portion and the connecting portion are bent to each other.

6. The display screen according to claim 5, wherein the connecting portion and the positioning portion are substantially perpendicular to each other, and the positioning portion is adjacent to the first through hole.

7. The display screen according to claim 5, wherein the positioning structure further comprises:
a first bending portion, connected to the second face and the connecting portion; and
a second bending portion, connected between the connecting portion and the positioning portion.

8. The display screen according to claim 1, further comprising at least one of:
a first plastic portion, formed on the first bending portion; and
a second plastic portion, formed on the second bending portion.

9. The display screen according to claim 1, wherein the display screen comprises a display area configured to display a screen of the mobile terminal or configured to be touched by a user, and the first through hole is surrounded by at least a portion of the display area.

10. A terminal display screen assembly, comprising:
a display screen, defining a first through hole penetrating the display screen in a thickness direction of the display screen, and comprising:
a display module;
a frame, comprising a first face and a second face opposite to the first face, and the display module being arranged on the first face; and
a positioning structure arranged on the second face and located around the first through hole; wherein the first through hole has a first sidewall, the first sidewall has a first projection projected on the frame, an outer wall of the positioning structure has a second projection projected on the frame, and the second projection surrounds the first projection; and
an optical device, comprising:
a first optical portion; and
a second optical portion;
wherein the first optical portion is arranged in the first through hole, the second optical portion is fixedly coupled to the positioning structure, and the second optical portion is positioned by the positioning structure.

11. The terminal display screen assembly according to claim 10, wherein the positioning structure extends from the second face of the frame in a direction from the first face towards the second face.

12. The terminal display screen assembly according to claim 10, wherein a distance between the first sidewall and the first optical portion is in a range of 0.18 millimeters to 0.4 millimeters.

13. The terminal display screen assembly according to claim 10, wherein a size of the positioning structure is gradually increased from an end of the positioning structure that is away from the second face to the other end of the positioning structure that contacts with the second face.

14. The terminal display screen assembly according to claim 10, wherein the positioning structure comprises a connecting portion and a positioning portion coupled to each other, the connecting portion is fixedly coupled to the second face of the display screen, the positioning portion and the connecting portion are bent to each other, and the positioning portion is fixedly coupled to the second optical portion.

15. The terminal display screen assembly according to claim 14, wherein the connecting portion and the positioning portion are substantially perpendicular to each other, and the positioning portion is adjacent to the first through hole.

16. The terminal display screen assembly according to claim 14, wherein the positioning structure further comprises:
a first bending portion, connected to the second face and the connecting portion; and
a second bending portion, connected between the connecting portion and the positioning portion;
wherein the terminal display screen assembly further comprises at least one of:
a first plastic portion, formed on the first bending portion; and
a second plastic portion, formed on the second bending portion.

17. A mobile terminal, comprising:
a housing; and
a terminal display screen assembly arranged in the housing;
wherein the terminal display screen assembly comprises:
a display screen, defining a first through hole penetrating the display screen in a thickness direction of the display screen, and comprising:
a display module;
a frame, comprising a first face and a second face opposite to the first face, and the display module being arranged on the first face; and
a positioning structure, arranged on the second face and located around the first through hole; wherein the first through hole has a first sidewall, the first sidewall has a first projection projected on the frame, an outer wall of the positioning structure has a second projection projected on the frame, and the second projection surrounds the first projection; and
an optical device, comprising:
a first optical portion; and a second optical portion;
wherein the first optical portion is arranged in the first through hole, the second optical portion is fixedly coupled to the positioning structure, and the second optical portion is positioned by the positioning structure.

18. The mobile terminal according to claim 17, wherein the mobile terminal comprises a main terminal display screen assembly and a secondary terminal display screen assembly, and the terminal display screen assembly is a main terminal display screen assembly or a secondary terminal display screen assembly of the mobile terminal; a display area of the main terminal display screen assembly is greater than a display area of the secondary terminal display screen assembly; the main terminal display screen assembly is arranged on one side of the housing; and the secondary terminal display screen assembly is arranged on the other side of the housing opposite to the main terminal display screen assembly.

19. The mobile terminal according to claim 17, wherein the housing comprises a second sidewall defining a second through hole penetrating the housing in a thickness direction of the housing, and the second through hole communicates with the first through hole;
the second optical portion is fixedly connected to the second sidewall.

20. The mobile terminal according to claim 19, wherein a diameter of the second through hole is greater than a diameter of the first through hole.

\* \* \* \* \*

UNITED STATES PATENT AND TRADEMARK OFFICE
CERTIFICATE OF CORRECTION

PATENT NO. : 10,963,004 B2  
APPLICATION NO. : 17/024243  
DATED : March 30, 2021  
INVENTOR(S) : Jiao Cheng It is certified that error appears in the above-identified patent and that said Letters Patent is hereby corrected as shown below:

On the Title Page

(63) Related U.S. Application Data:
"Continuation of application No. 16/364,041, filed on Mar. 25, 2019, now Pat. No. 10,860,055"

Should read as:
--Continuation of application No. 16/364,041, filed on Mar. 25, 2019, now Pat. No. 10,890,940--

Signed and Sealed this  
Fourth Day of May, 2021

Drew Hirshfeld  
*Performing the Functions and Duties of the*  
*Under Secretary of Commerce for Intellectual Property and*  
*Director of the United States Patent and Trademark Office*